(12) United States Patent
Park et al.

(10) Patent No.: US 10,831,095 B2
(45) Date of Patent: Nov. 10, 2020

(54) CRITICAL DIMENSION MEASUREMENT SYSTEM AND METHOD OF MEASURING CRITICAL DIMENSIONS USING SAME

(71) Applicant: SAMSUNG ELECTRONICS CO., LTD., Suwon-si (KR)

(72) Inventors: Won Joo Park, Hwaseong-si (KR); Hyung Joo Lee, Suwon-si (KR); Seuk Hwan Choi, Hwaseong-si (KR); Dong Seok Nam, Yongin-si (KR); Yoon Taek Han, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 197 days.

(21) Appl. No.: 15/973,912

(22) Filed: May 8, 2018

(65) Prior Publication Data

US 2019/0094684 A1    Mar. 28, 2019

(30) Foreign Application Priority Data

Sep. 22, 2017  (KR) .................. 10-2017-0122302

(51) Int. Cl.
| | | |
|---|---|---|
| *G06F 30/00* | (2020.01) | |
| *G03F 1/70* | (2012.01) | |
| *G01N 27/60* | (2006.01) | |
| *G01B 15/00* | (2006.01) | |
| *G03F 1/84* | (2012.01) | |

(52) U.S. Cl.
CPC .............. *G03F 1/70* (2013.01); *G01B 15/00* (2013.01); *G01N 27/60* (2013.01); *G03F 1/84* (2013.01); *G01B 2210/56* (2013.01)

(58) Field of Classification Search
CPC .................................. G03F 1/70; G01B 15/00
USPC ........................................................... 716/51
See application file for complete search history.

(56) References Cited

U.S. PATENT DOCUMENTS

| | | | |
|---|---|---|---|
| 5,164,790 A | * | 11/1992 | McNeil .................. G01B 11/02 356/496 |
| 7,593,100 B2 | | 9/2009 | Okita |
| 7,700,903 B2 | | 4/2010 | Weiss et al. |
| 8,013,315 B2 | | 9/2011 | Watanabe et al. |
| 9,297,727 B2 | | 3/2016 | Buxbaum |
| 9,368,324 B2 | | 6/2016 | Li et al. |
| 9,508,611 B2 | | 11/2016 | Kimura et al. |

(Continued)

FOREIGN PATENT DOCUMENTS

KR        10-0678464        1/2007

*Primary Examiner* — Suchin Parihar
(74) *Attorney, Agent, or Firm* — F. Chau & Associates, LLC

(57) ABSTRACT

A critical dimension measurement system includes a voltage measurement circuit, a control circuit, and a critical dimension measurement circuit. The voltage measurement circuit may measure potentials of mask patterns of a photomask. The control circuit may include an information storage circuit for storing distribution information on the potentials of the mask patterns, measured by the voltage measurement circuit, and information on layout patterns corresponding to the mask patterns of the photomask. The critical dimension measurement circuit may be operated, by the control circuit, in a first measurement mode and a second measurement mode running for a shorter time than the first measurement mode, and measure critical dimensions of the mask patterns.

20 Claims, 12 Drawing Sheets

(56) References Cited

U.S. PATENT DOCUMENTS

| | | | |
|---|---|---|---|
| 9,576,772 B1 | 2/2017 | Arjavac et al. | |
| 2011/0122395 A1* | 5/2011 | Ben-Zvi | G03F 1/84 |
| | | | 356/51 |
| 2013/0080984 A1* | 3/2013 | Liu | G06F 30/23 |
| | | | 716/112 |
| 2013/0321609 A1* | 12/2013 | Seitz | G02B 21/0016 |
| | | | 348/79 |
| 2014/0019927 A1 | 1/2014 | Yudhistira et al. | |
| 2015/0041648 A1* | 2/2015 | Shirahata | H01J 37/244 |
| | | | 250/307 |

* cited by examiner

CRITICAL DIMENSION MEASUREMENT SYSTEM AND METHOD OF MEASURING CRITICAL DIMENSIONS USING SAME

CROSS-REFERENCE TO RELATED APPLICATION

This application claims priority under 35 U.S.C. § 119 to Korean Patent Application No. 10-2017-0122302, filed on Sep. 22, 2017 in the Korean Intellectual Property Office, the disclosure of which is incorporated by reference herein in its entirety.

TECHNICAL FIELD

Exemplary embodiments of the present inventive concept relate to a critical dimension measurement system and a critical dimension measurement method, and more particularly, to a critical dimension measurement system which may measure critical dimensions of mask patterns, and a method of measuring critical dimensions using the same.

DISCUSSION OF RELATED ART

With increases in degrees of integration and performance of semiconductor devices, the number of design rules with regard thereto is decreasing, and the widths of patterns forming semiconductor devices are being narrowed. The size of mask patterns of photomasks used in photolithography processes, as well as the size of photoresist patterns for forming the patterns to form semiconductor devices, as described above, is being reduced. As the size of mask patterns decreases, an amount of time required to measure the critical dimensions of mask patterns is increased.

SUMMARY

According to an exemplary embodiment of the present inventive concept, a critical dimension measurement system includes a voltage measurement circuit, a control circuit, and a critical dimension measurement circuit. The voltage measurement circuit may measure potentials of mask patterns of a photomask. The control circuit may include an information storage circuit for storing distribution information on the potentials of the mask patterns, measured by the voltage measurement circuit, and information on layout patterns corresponding to the mask patterns of the photomask. The critical dimension measurement circuit may be operated, by the control circuit, in a first measurement mode and a second measurement mode running for a shorter time than the first measurement mode, and measure critical dimensions of the mask patterns.

According to an exemplary embodiment of the present inventive concept, a critical dimension measurement system includes a surface potential measurement circuit, a control circuit, and a critical dimension measurement circuit. The surface potential measurement circuit may measure potentials of mask patterns of a photomask. The control circuit may include an information storage part configured to store distribution information on the potentials of the mask patterns measured by the surface potential measurement circuit. The critical dimension measurement circuit may exchange an electrical signal with the control circuit, and measure critical dimensions of the mask patterns of the photomask, transferred from the surface potential measurement circuit, in a default measurement mode and a simple measurement mode running for a shorter time than the default measurement mode, using the distribution information on the potentials of the mask patterns.

According to an exemplary embodiment of the present inventive concept, a critical dimension measurement system includes a surface potential measurement circuit and a critical dimension measurement circuit. The surface potential measurement circuit may measure potentials of mask patterns. The critical dimension measurement circuit may measure critical dimensions of the mask patterns, transferred from the surface potential measurement circuit, in a default measurement mode and a simple measurement mode running for a shorter time than the default measurement mode, using distribution information on the measured potentials of the mask patterns.

According to an exemplary embodiment of the present inventive concept, a method of measuring critical dimensions includes forming a layout including layout patterns, forming a photomask including mask patterns corresponding to the layout patterns, storing information on the layout patterns, classifying measurement sites of the photomask as a default measurement site and a simple measurement site, using the information on the layout patterns, measuring critical dimensions of a first mask pattern within the default measurement site in a default measurement mode, and measuring critical dimensions of a second mask pattern within the simple measurement site in a simple measurement mode. The simple measurement mode may run for a shorter time than the default measurement mode.

According to an exemplary embodiment of the present inventive concept, a method of measuring critical dimensions includes forming a layout including layout patterns, forming mask patterns corresponding to the layout patterns, setting, with a control circuit of a critical dimension measurement apparatus, a default measurement mode and a simple measurement mode running for a shorter time than the default measurement mode, using information on the layout patterns, and measuring critical dimensions of the mask patterns with the critical dimension measurement apparatus. Critical dimensions of first mask patterns of the mask patterns may be measured in the default measurement mode, and critical dimensions of second mask patterns of the mask patterns may be measured in the simple measurement mode.

According to an exemplary embodiment of the present inventive concept, a method of measuring critical dimensions includes forming a layout including layout patterns, using a computer system, forming a photomask including mask patterns corresponding to the layout patterns, using a mask manufacturing apparatus, storing information on a default measurement site and a simple measurement site of the photomask with a critical dimension measurement apparatus, measuring, with the critical dimension measurement apparatus, critical dimensions of a first mask pattern within the default measurement site in a default measurement mode, and measuring, with the critical dimension measurement apparatus, critical dimensions of a second mask pattern within the simple measurement site in a simple measurement mode running for a shorter time than the default measurement mode.

BRIEF DESCRIPTION OF DRAWINGS

The above and other aspects and features of the present inventive concept will be more clearly understood by describing in detail exemplary embodiments thereof with reference to the accompanying drawings.

DETAILED DESCRIPTION OF THE EMBODIMENTS

Figure 1:
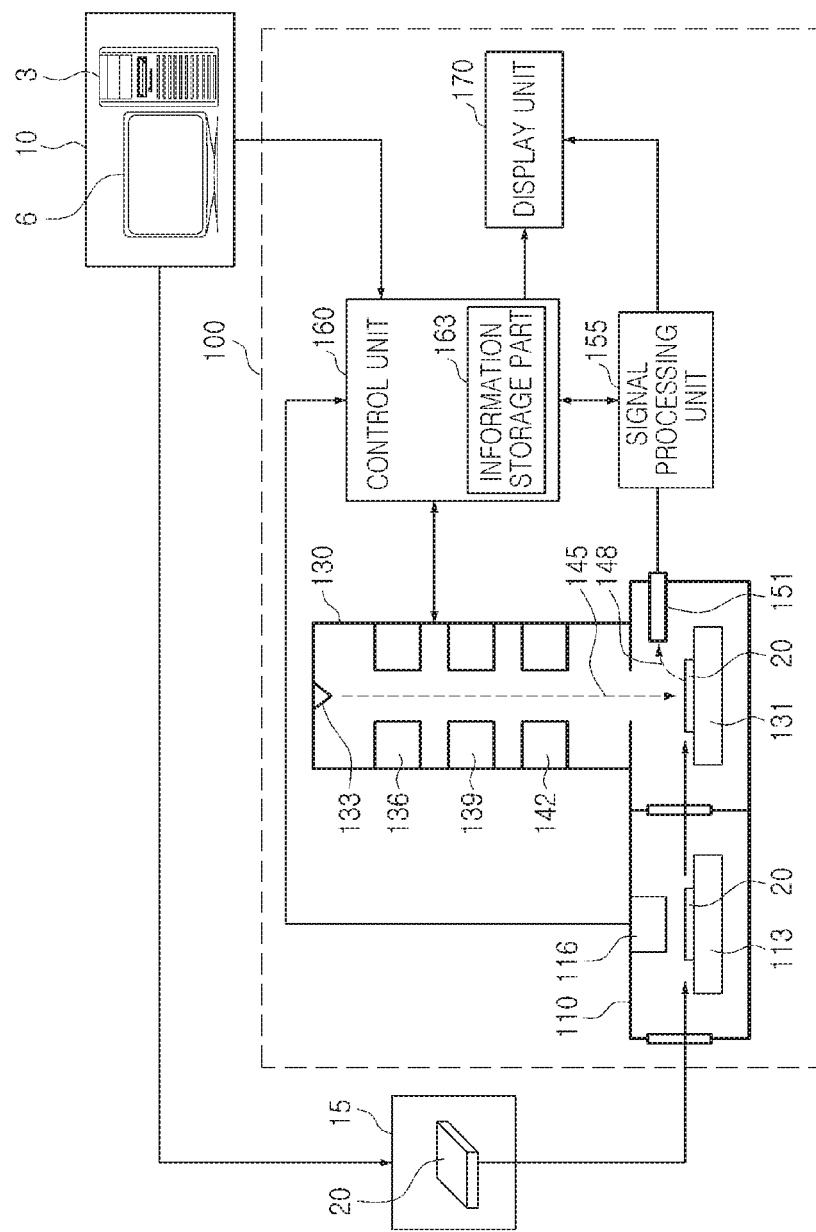
FIG. 1 is a block diagram schematically illustrating a critical dimension measurement system, according to an exemplary embodiment of the present inventive concept.

Exemplary embodiments of the present inventive concept provide a critical dimension measurement system, which may reduce an amount of time required to measure critical dimensions.

Exemplary embodiments of the present inventive concept also provide a method of measuring critical dimensions, which may reduce an amount of time required to measure critical dimensions.

Exemplary embodiments of the present inventive concept will be described more fully hereinafter with reference to the accompanying drawings. Like reference numerals may refer to like elements throughout this application.

An example of a critical dimension measurement system, according to an exemplary embodiment of the present inventive concept, will be described below. FIG. 1 is a block diagram schematically illustrating a critical dimension measurement system, according to an exemplary embodiment of the present inventive concept.

Referring to FIG. 1, the critical dimension measurement system may include a computer system 10, a mask manufacturing apparatus 15, and a critical dimension measurement apparatus 100.

The computer system 10 may include a workstation 3, and a terminal or a display device 6 connected to the workstation 3. The computer system 10 may include a design tool able to design semiconductor integrated circuits (ICs) and/or a layout tool able to draw layouts of designed ICs. Thus, the critical dimension measurement system may form a layout including layout patterns, using the computer system 10.

The critical dimension measurement system may form a photomask 20, using a layout formed using the computer system 10. The photomask 20 may be formed by the mask manufacturing apparatus 15. The photomask 20 may include mask patterns corresponding to the layout patterns of the layout.

The critical dimensions of the mask patterns of the photomask 20 may be measured with the critical dimension measurement apparatus 100. The critical dimension measurement apparatus 100 may be a critical dimension scanning electron microscope (CD-SEM).

In an exemplary embodiment of the present inventive concept, the critical dimension measurement apparatus 100 may include a surface potential measurement unit 110, a critical dimension measurement unit 130, a signal processing unit 155, a display unit 170, and a control unit 160.

The photomask 20, formed by the mask manufacturing apparatus 15, may be moved onto a first stage 113 within the surface potential measurement unit 110. The surface potential measurement unit 110 may include a surface potential measurement device 116 able to measure the potential of the mask patterns of the photomask 20 placed on the first stage 113. For example, the surface potential measurement unit 110 may be a voltage measurement unit and the surface potential measurement device 116 may be a voltage measurement device.

The critical dimension measurement unit may include a second stage 131 on which the photomask 20, including the mask patterns of which the potential has been measured by the surface potential measurement unit 110, may be moved, placed, and aligned.

The critical dimension measurement unit 130 may include an electron beam irradiation device irradiating, with an electron beam 145, the surface of the photomask 20 placed on the second stage 131, and a detector 151 detecting secondary electrons 148 generated by irradiating the surface of the photomask 20 with the electron beam 145. The critical dimension measurement unit 130 may operate in a default measurement mode or in a simple measurement mode running for a shorter time than the default measurement mode.

The electron beam irradiation device may include an electron gun 133, a condenser lens 136, a deflecting coil 139, and an object lens 142. The electron gun 133 may emit electrons. Electrons, emitted from the electron gun 133, may be converted into the electron beam 145, while sequentially passing through the condenser lens 136, the deflecting coil 139, and the object lens 142, to be radiated onto the surface of the photomask 20 aligned on the second stage 131.

The amount of the secondary electrons 148, detected by the detector 151, may be converted into image data by the signal processing unit 155, and such image data may be displayed as an image on the display unit 170.

The control unit 160 may include an information storage part 163. The information storage part 163 may store programs and information for measuring the critical dimensions of the mask patterns of the photomask 20. The information storage part 163 may also store information on the layout patterns of the layout formed by the computer system 10. The information storage part 163 may further store information on the surface potential distribution of the photomask 20 measured by the surface potential measurement unit 110. The information on the surface potential distribution of the photomask 20 may include information on the potential of the mask patterns.

The control unit 160 may exchange an electrical signal with the critical dimension measurement unit 130. The control unit 160 may control the critical dimension measurement unit 130 to operate in the default measurement mode or in the simple measurement mode, using the information on the layout patterns and the information on the surface potential distribution of the photomask 20 stored in the information storage part 163. The control unit 160 may calculate the critical dimensions of the mask patterns, using information on the mask patterns of the photomask 20, for example, images of the mask patterns of the photomask 20, obtained according to operations of the critical dimension measurement unit 130. The information storage part 163, included in the control unit 160, may store the images and the critical dimensions of the mask patterns of the photomask 20.

According to an exemplary embodiment of the present inventive concept, the surface potential measurement unit 110, the critical dimension measurement unit 130, the signal processing unit 155, the display unit 170, the control unit 160, and the information storage part 163 may be circuits.

Figure 2:
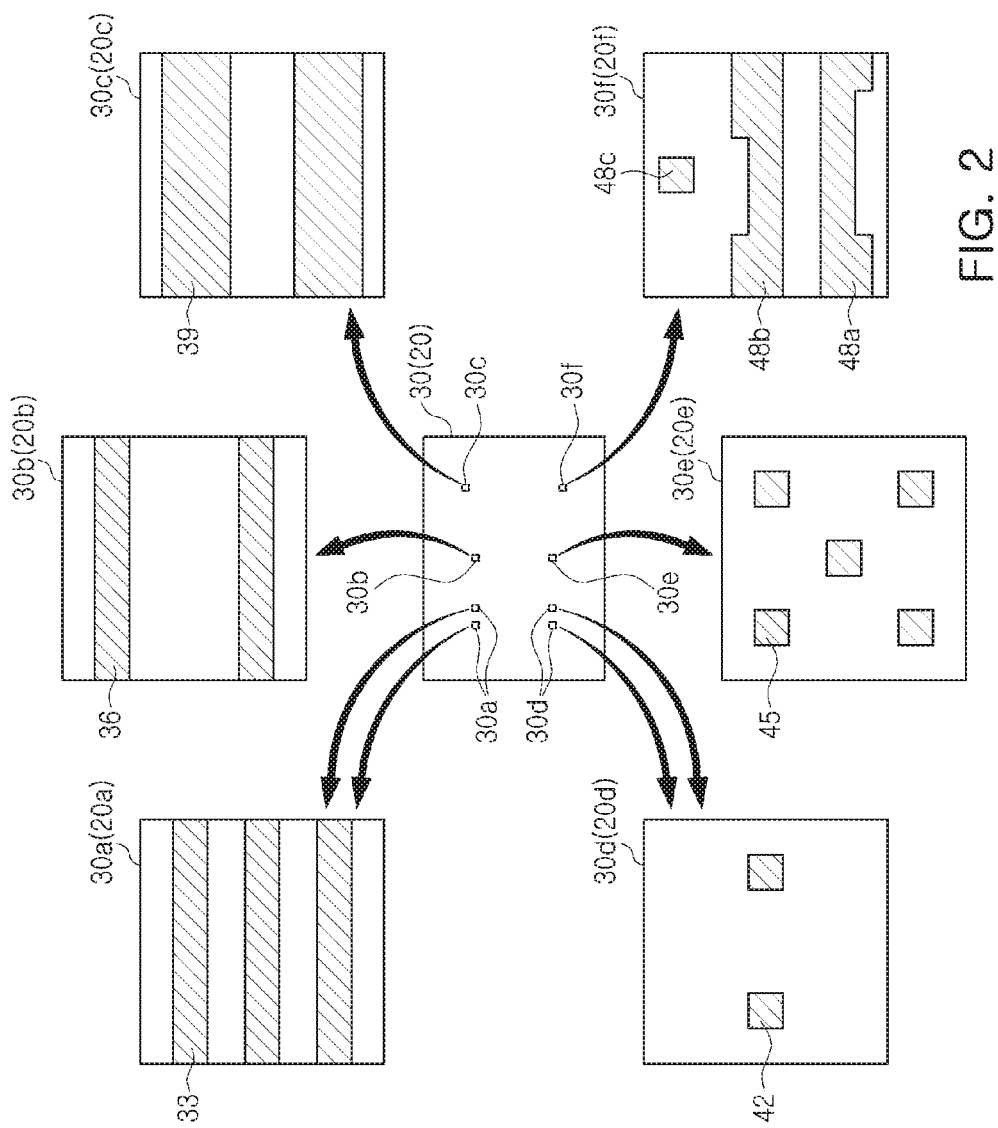
FIG. 2 is a conceptual plan view illustrating a layout, according to an exemplary embodiment of the present inventive concept.

An example of the layout that may be formed by the computer system 10 will be described with reference to FIG. 2. FIG. 2 is a conceptual plan view of a layout, according to an exemplary embodiment of the present inventive concept.

Referring to FIG. 2, a layout 30 that may be formed by the computer system 10 of FIG. 1 may have layout areas 30a to 30f. The layout areas 30a to 30f may include layout patterns.

In an example, the layout areas 30a to 30f may include a first layout area 30a, a second layout area 30b, a third layout area 30c, a fourth layout area 30d, a fifth layout area 30e, and a sixth layout area 30f.

In an example, the layout areas 30a to 30f may include various shapes and sizes of layout patterns. For example, the first to third layout areas 30a to 30c may be areas including layout patterns 33, 36, and 39 having a line shape, such as a wiring or the like, the fourth and fifth layout areas 30d and 30e may be areas including layout patterns 42 and 45 having an isolated shape, such as a contact or pad, and the sixth layout area 30f may be an area including layout patterns 48a and 48b having a line shape as well as a layout pattern 48c having an isolated shape.

In an example, a portion of the layout areas 30a to 30f may include the same shape and size of layout patterns. For example, the first layout area 30a may be provided as a plurality of first layout areas 30a, which may include the same shape and size of layout patterns 33. Similarly, the fourth layout area 30d may be provided as a plurality of fourth layout areas 30d, which may include the same shape and size of layout patterns 42.

In an example, the layout patterns 33 within the first layout area 30a may have a higher arrangement density than the layout patterns 36 within the second layout area 30b.

In an example, the layout patterns 39 within the third layout area 30c may have a greater width than the layout patterns 33 within the first layout area 30a and/or the layout patterns 36 within the second layout area 30b.

In an example, the layout patterns 42 within the fourth layout area 30d may have a lower arrangement density than the layout patterns 45 within the fifth layout area 30e.

In FIG. 2, the layout patterns 33, 36, 39, 42, 45, 48a, 48b, and 48c within the first to sixth layout areas 30a to 30f are intended to illustrate exemplary embodiments of the present inventive concept, and may be modified to have various shapes and sizes.

In an exemplary embodiment of the present inventive concept, the layout patterns 33, 36, 39, 42, 45, 48a, 48b, and 48c of the layout 30 may correspond to the mask patterns of the photomask 20, as described above with reference to FIG. 1. Thus, the layout 30 of FIG. 2 may be replaced with the photomask 20, for the purpose of description. Further, the layout patterns 33, 36, 39, 42, 45, 48a, 48b, and 48c of the layout 30 of FIG. 2 may be replaced with the mask patterns of the photomask 20, for the purpose of description. Moreover, planar shapes of the layout patterns 33, 36, 39, 42, 45, 48a, 48b, and 48c of the layout 30 of FIG. 2 may be those of the mask patterns of the photomask 20.

In an example, the first to sixth layout areas 30a to 30f of the layout 30 may correspond to first to sixth measurement sites 20a to 20f of the photomask 20. The first to sixth measurement sites 20a to 20f of the photomask 20 of FIG. 1 may be set by allowing semiconductor designers, developers, or engineers to designate areas of a photomask in which defects may be highly likely to occur, or areas having patterns of which the critical dimensions are required to be measured.

In an exemplary embodiment of the present inventive concept, the layout patterns of each of the layout areas 30a to 30f may have measurement regions of interest. The measurement regions of interest may be areas which are required to be measured. Here, the measurement regions of interest of the layout patterns may also be areas for measuring the critical dimensions of the mask patterns within the measurement sites of the photomask 20. For example, the measurement regions of interest may be areas of layout patterns corresponding to areas of mask patterns, of which the critical dimensions are required to be measured, of the photomask 20 of FIG. 1.

Figure 3:
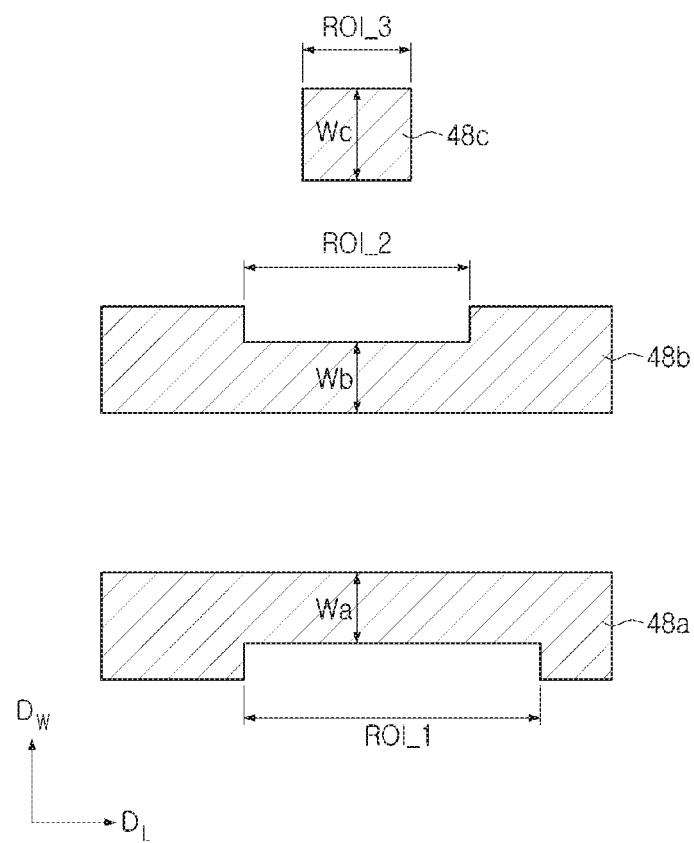
FIG. 3 is a plan view illustrating measurement regions of interest of layout patterns, according to an exemplary embodiment of the present inventive concept.

An example of the above-mentioned measurement regions of interest of the layout patterns will be described with reference to FIG. 3. FIG. 3 is a plan view illustrating measurement regions of interest of layout patterns, according to an exemplary embodiment of the present inventive concept. Planar shapes and sizes of layout patterns 48a, 48b, and 48c, as illustrated in FIG. 3, are only examples, and may be modified in various manners.

Referring to FIG. 3, the layout 30 may include a first line layout pattern 48a, a second line layout pattern 48b, and a third isolated layout pattern 48c.

The first line layout pattern 48a may include a first measurement region of interest ROI_1, the second line layout pattern 48b may include a second measurement region of interest ROI_2, and the third isolated layout pattern 48c may include a third measurement region of interest ROI_3.

In an example, the lengths of the first and second measurement regions of interest ROI_1 and ROI_2 may be greater than that of the third measurement region of interest ROI_3. In an example, the length of the first measurement region of interest ROI_1 may be greater than that of the second measurement region of interest ROI_2.

In an example, the first line layout pattern 48a, the second line layout pattern 48b, and the third isolated layout pattern 48c may be the layout patterns of the sixth layout area 30f described above with reference to FIG. 2. Thus, information on the first to third measurement regions of interest ROI_1 to ROI_3 of the first line layout pattern 48a, the second line layout pattern 48b, and the third isolated layout pattern 48c of the sixth layout area 30f may be stored in the information storage part 163 of the control unit 160 of FIG. 1. The information on the first to third measurement regions of interest ROI_1 to ROI_3 may include information on the lengths and widths Wa, Wb, and Wc of the first to third measurement regions of interest ROI_1 to ROI_3.

The information on the first to third measurement regions of interest ROI_1 to ROI_3 may be used to measure the critical dimensions of mask patterns within the sixth measurement site 20f of the photomask 20. To measure the critical dimensions of the mask patterns, the electron beam 145, described above with reference to FIG. 1, may be radiated to areas of the mask patterns corresponding to the first to third measurement regions of interest ROI_1 to ROI_3 of the first line layout pattern 48a, the second line layout pattern 48b, and the third isolated layout pattern 48c of the sixth layout area 30f in a width direction $D_W$, perpendicular to a length direction $D_L$ of the first to third measurement regions of interest ROI_1 to ROI_3.

Since the layout 30 may be formed using the computer system 10 of FIG. 1, the lengths and the widths Wa, Wb, and Wc of the first to third measurement regions of interest ROI_1 to ROI_3 of the layout patterns 48a, 48b, and 48c of the layout 30 may be obtained by software.

Figure 4:
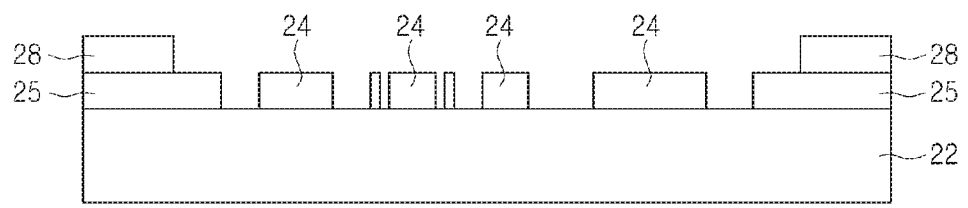
FIG. 4 is a cross-sectional view illustrating a photomask, according to an exemplary embodiment of the present inventive concept.

An example of the photomask 20, including the mask patterns, will be described with reference to FIG. 4. FIG. 4 is a cross-sectional view illustrating a photomask, according to an exemplary embodiment of the present inventive concept.

Referring to FIG. 4, the photomask 20 may include a substrate 22 and mask patterns 24 disposed on the substrate 22. In an example, the photomask 20 may be a phase inversion mask. However, the present inventive concept is not limited thereto. For example, the photomask 20 may be a binary mask. Hereinafter, the phase inversion mask will be illustrated as an example, for convenience of description.

The photomask 20 may include an outer mask pattern 25 surrounding the mask patterns 24, and a light blocking pattern 28 covering the outer mask pattern 25.

The substrate 22 may be a transparent substrate. For example, the substrate 22 may be formed of glass or quartz. Each of the mask patterns 24 and the outer mask pattern 25 may be formed of a compound of molybdenum (Mo) and silicon (Si). For example, the mask patterns 24 and the outer mask pattern 25 may be formed of a MoSi compound, or a MoSi compound containing impurities, for example, nitrogen (N) and/or oxygen (O). The light blocking pattern 28 may be formed of a material able to block light. For example, the light blocking pattern 28 may be formed of a metal material, such as chromium (Cr) or the like, or an inorganic material.

In an example, the mask patterns 24 may have a planar shape corresponding to those of the layout patterns 33, 36, 39, 42, 45, 48a, 48b, and 48c of the layout 30.

Figure 5:
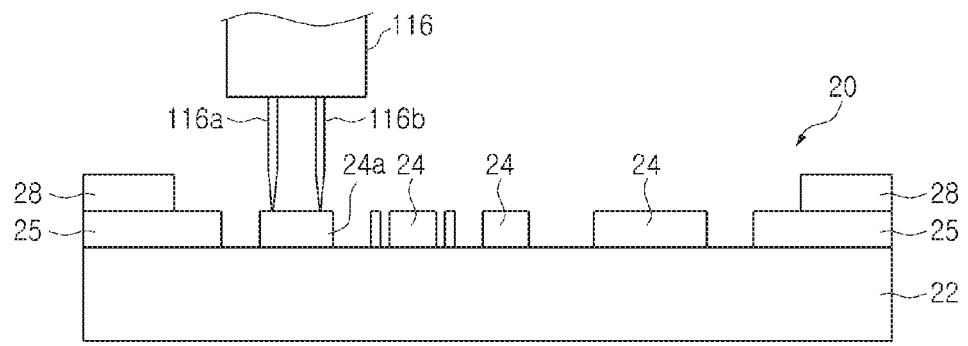
FIG. 5 is a schematic cross-sectional view illustrating a surface potential measurement device measuring the potential of mask patterns of a photomask, according to an exemplary embodiment of the present inventive concept.

As described above with reference to FIG. 1, the surface potential measurement unit 110 may include the surface potential measurement device 116. An example of the surface potential measurement device 116 will be described with reference to FIG. 5. FIG. 5 is a schematic cross-sectional view illustrating a surface potential measurement device measuring the potential of mask patterns of a photomask, according to an exemplary embodiment of the present inventive concept.

Referring to FIG. 5, the surface potential measurement device 116 of the surface potential measurement unit 110, described above with reference to FIG. 1, may include at least two probes 116a and 116b. For example, the potential of a mask pattern 24a to be measured may be measured by moving the at least two probes 116a and 116b of the surface potential measurement device 116 up and down, such that the at least two probes 116a and 116b may be in contact with the mask pattern 24a to be measured, of the mask patterns 24 of the photomask 20. The mask pattern 24a to be measured may be a mask pattern having a shape corresponding to that of any one of the layout patterns 33, 36, 39, 42, 45, 48a, 48b, and 48c described above with reference to FIG. 2.

Figure 6:
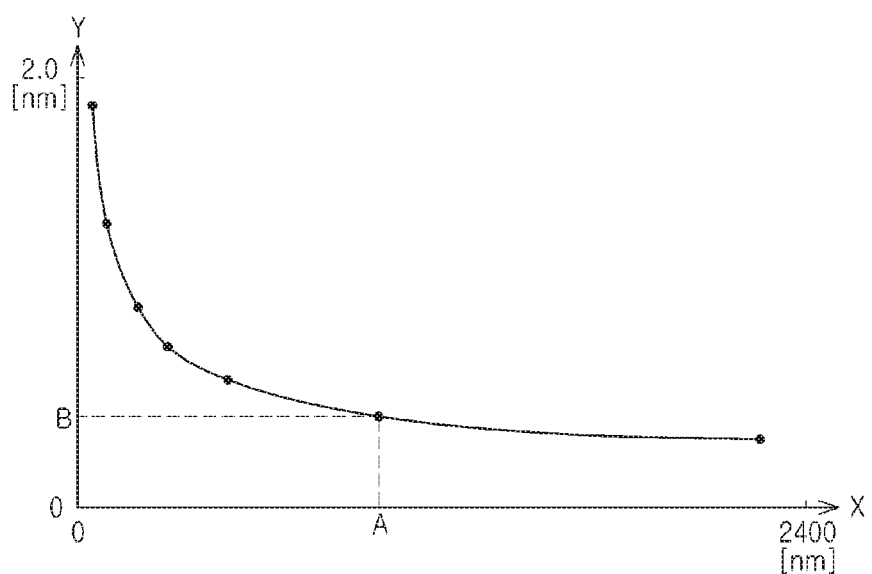
FIG. 6 is a graph illustrating the relationship between the length of measurement regions of interest and reproducibility according to an exemplary embodiment of the present inventive concept.

FIG. 6 is a graph illustrating the relationship between the length of measurement regions of interest and reproducibility according to an exemplary embodiment of the inventive concept. In FIG. 6, the horizontal axis X represents the length of measurement regions of interest, and the vertical axis Y represents reproducibility. The vertical axis Y may be the difference between the actual width of a mask pattern, and the width of the mask pattern measured with the critical dimension measurement apparatus, or may be an error caused by an instrument. The graph, illustrated in FIG. 6, may be obtained while the critical dimension measurement apparatus is set up using a reference photomask.

In FIG. 6, the length of a measurement region of interest (ROLL) may increase in the horizontal axis X direction, and a difference between the actual width of the mask pattern and the width of the mask pattern measured with the critical dimension measurement apparatus may increase in the vertical axis Y direction. In the graph of FIG. 6, a length A of a reference measurement region of interest on the horizontal axis X is displayed, and a reference difference B on the vertical axis Y as described above may be understood as a significantly increased error of an allowable mask pattern width.

It can be seen from the graph of FIG. 6 that, when the length of the measurement region of interest is greater than the length A of the reference measurement region of interest, the reliability of critical dimensions measured with the critical dimension measurement apparatus may be high, and when the length of the measurement region of interest is less than the length A of the reference measurement region of interest, the reliability of critical dimensions measured with the critical dimension measurement apparatus may be low.

Figure 7A:
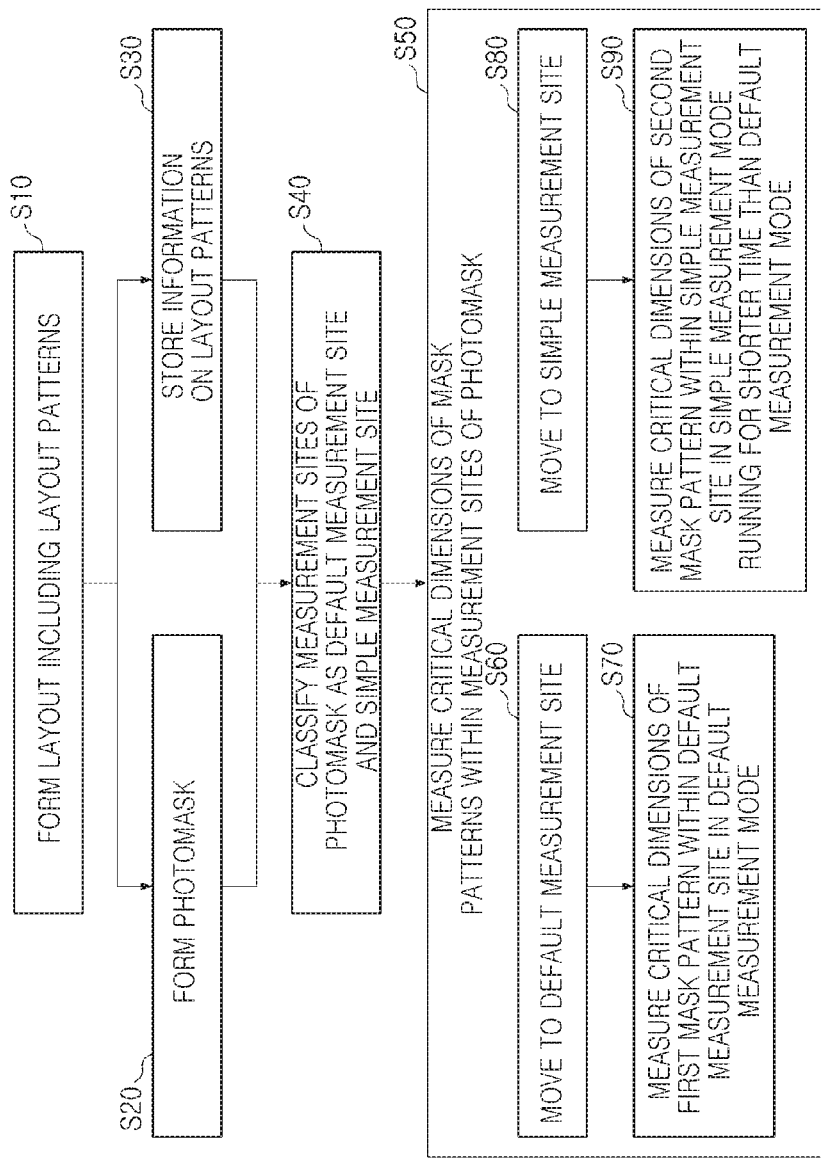
FIG. 7A is a flowchart illustrating a method of measuring critical dimensions, according to an exemplary embodiment of the present inventive concept.
Figure 7B:
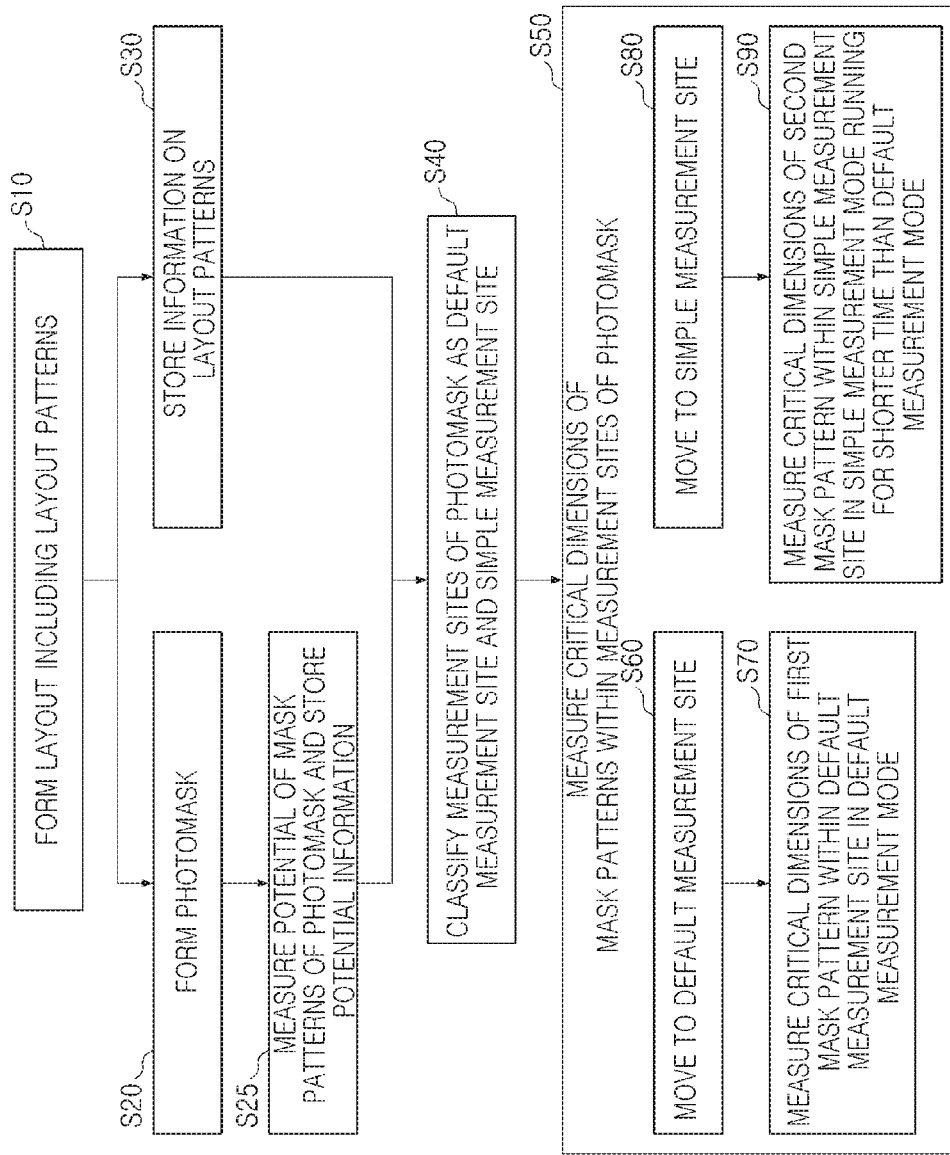
FIG. 7B is a flowchart illustrating a method of measuring critical dimensions, according to an exemplary embodiment of the present inventive concept.

Examples of a method of measuring critical dimensions of mask patterns of a photomask, according to exemplary embodiments of the present inventive concept, will be described below. FIG. 7A is a flowchart illustrating a method of measuring critical dimensions, according to an exemplary embodiment of the present inventive concept, and FIG. 7B is a flowchart illustrating a method of measuring critical dimensions, according to an exemplary embodiment of the present inventive concept.

Referring to FIGS. 1, 6, and 7A, the layout 30 including the layout patterns 33, 36, 39, 42, 45, 48a, 48b, and 48c may be formed (S10). The layout 30 may be formed using the computer system 10. The photomask 20 may be formed (S20). The photomask 20 may be formed by the mask manufacturing apparatus 15.

The information on the layout patterns 33, 36, 39, 42, 45, 48a, 48b, and 48c may be stored (S30). The information on the layout patterns 33, 36, 39, 42, 45, 48a, 48b, and 48c may be stored in the information storage part 163 of the control unit 160 included in the critical dimension measurement apparatus 100. The information on the layout patterns 33, 36, 39, 42, 45, 48a, 48b, and 48c may include information on the shape (or image), arrangement density, and width of each of the layout patterns 33, 36, 39, 42, 45, 48a, 48b, and 48c, and on the lengths of measurement regions of interest of the layout patterns 33, 36, 39, 42, 45, 48a, 48b, and 48c.

The measurement sites of the photomask 20 may be classified as a default measurement site and a simple measurement site (S40). The control unit 160 of FIG. 1 may classify the measurement sites of the photomask 20 as the default measurement site and the simple measurement site, and the information storage part 163 of the control unit 160 of FIG. 1 may store information on the default measurement site and the simple measurement site. Classifying the measurement sites of the photomask 20 as the default measurement site and the simple measurement site may include using the information on the layout patterns 33, 36, 39, 42, 45, 48*a*, 48*b*, and 48*c*. The information on the layout patterns 33, 36, 39, 42, 45, 48*a*, 48*b*, and 48*c* may include the information on the arrangement density and width of each of the layout patterns 33, 36, 39, 42, 45, 48*a*, 48*b*, and 48*c*, and on the lengths of measurement regions of interest of the layout patterns 33, 36, 39, 42, 45, 48*a*, 48*b*, and 48*c*.

In FIG. 7B, the potential of the mask patterns of the photomask may be measured, and information on the potential may be stored (S25). Thus, classifying the measurement sites of the photomask 20 as the default measurement site and the simple measurement site may include using the potential information on the mask patterns, described above with reference to FIG. 7A, together with the information on the layout patterns 33, 36, 39, 42, 45, 48*a*, 48*b*, and 48*c*.

Referring to FIG. 1 through 6, and 7A or 7B, the critical dimensions of the mask patterns within the measurement sites of the photomask 20 may be measured (S50). The critical dimension measurement unit may be moved to the default measurement site (S60). Subsequently, the critical dimensions of a first mask pattern within the default measurement site may be measured in the default measurement mode (S70).

The critical dimension measurement unit may be moved to the simple measurement site (S80). Subsequently, the critical dimensions of a second mask pattern within the simple measurement site may be measured in the simple measurement site running for a shorter time than the default measurement mode (S90).

In an example, measuring the critical dimensions of the mask patterns within the measurement sites of the photomask 20 may include moving to the default measurement site, measuring the critical dimensions of the first mask pattern within the default measurement site in the default measurement mode, moving to the simple measurement site, and measuring the critical dimensions of the second mask pattern within the simple measurement site in the simple measurement mode. In a different manner, measuring the critical dimensions of the mask patterns within the measurement sites of the photomask 20 may include moving to the simple measurement site, measuring the critical dimensions of the second mask pattern within the simple measurement site in the simple measurement mode, moving to the default measurement site, and measuring the critical dimensions of the first mask pattern within the default measurement site in the default measurement mode.

With reference to FIG. 2, since the photomask 20 is formed using the layout 30, the first to sixth layout areas 30*a* to 30*f* of the layout 30 may be replaced with the first to sixth measurement sites 20*a* to 20*f* of the photomask 20, and the layout patterns 33, 36, 39, 42, 45, 48*a*, 48*b*, and 48*c* may be replaced with the mask patterns of the photomask 20, for the purpose of description.

In an exemplary embodiment of the present inventive concept, among the first to sixth measurement sites 20*a* to 20*f* of the photomask 20, the default measurement site may be a site with a mask pattern having a high degree of difficulty of critical dimension measurement, and the simple measurement site may be a site with a mask pattern having a low degree of difficulty of critical dimension measurement.

In an example, the first to sixth measurement sites 20*a* to 20*f* of the photomask 20 may be classified as a preceding measurement site of which the critical dimension measurement is performed, and a subsequent measurement site of which the critical dimension measurement is performed immediately after the critical dimension measurement of the preceding measurement site. The preceding measurement site and the subsequent measurement site may be classified as a default measurement site or a simple measurement site, using information on a layout pattern corresponding to a mask pattern within the preceding measurement site and on a layout pattern corresponding to a mask pattern within the subsequent measurement site.

In an example, when a measurement site that may be the preceding measurement site among the first to sixth measurement sites 20*a* to 20*f* of the photomask 20 is the default measurement site, a measurement site that may be the subsequent measurement site thereamong may be the default measurement site or the simple measurement site. For example, when a degree of difficulty of critical dimension measurement of a mask pattern within the subsequent measurement site is lower than a degree of difficulty of critical dimension measurement of a mask pattern within the preceding measurement site that may be the default measurement site, the subsequent measurement site may be set or classified as the simple measurement site. In a different manner, when a degree of difficulty of critical dimension measurement of a mask pattern within the subsequent measurement site is higher than or equal to a degree of difficulty of critical dimension measurement of a mask pattern within the preceding measurement site that may be the default measurement site, the subsequent measurement site may be set or classified as the default measurement site.

In an example, when the shapes and sizes of a mask pattern within the subsequent measurement site and a mask pattern within the preceding measurement site are substantially the same, the subsequent measurement site may be set or classified as the simple measurement site. For example, when the first measurement sites 20*a* corresponding to the first layout areas 30*a*, described above with reference to FIG. 2, are set as the preceding measurement site and the subsequent measurement site, one first measurement site 20*a* that may be the preceding measurement site of which the critical dimension measurement is performed first, among the first measurement sites 20*a* including mask patterns having substantially the same shape and size, may be set as the default measurement site, and another first measurement site 20*a*, of which the critical dimension measurement is performed after the critical dimension measurement of the one first measurement site 20*a*, may be set as the simple measurement site.

In exemplary embodiments of the present inventive concept, a mask pattern within the default measurement site, among the first measurement sites 20*a*, may be designated as a first mask pattern or a default mask pattern, and a mask pattern within the simple measurement site thereamong may be designated as a second mask pattern or a simple mask pattern.

In an example, when the critical dimension measurement is sequentially performed on the first and second measurement sites 20*a* and 20*b* corresponding to the first and second layout areas 30*a* and 30*b*, described above with reference to FIG. 2, the arrangement density of mask patterns within the second measurement site 20*b* may be lower than that of mask patterns within the first measurement site 20*a*. Thus, the first measurement site 20*a* that may be the preceding measurement site may be set as the default measurement site, and the second measurement site 20*b* that may be the subsequent measurement site may be set as the simple measurement site.

In an example, when the critical dimension measurement is sequentially performed on the first and third measurement sites 20*a* and 20*c* corresponding to the first and third layout areas 30a and 30c, described above with reference to FIG. 2, the size or width of mask patterns within the third measurement site 20c may be greater than that of mask patterns within the first measurement site 20a. Thus, the first measurement site 20a that may be the preceding measurement site may be set as the default measurement site, and the third measurement site 20c that may be the subsequent measurement site may be set as the simple measurement site.

In an example, when the critical dimension measurement is sequentially performed on the first and sixth measurement sites 20a and 20f corresponding to the first and sixth layout areas 30a and 30f, described above with reference to FIG. 2, a degree of difficulty of critical dimension measurement of mask patterns within the first measurement site 20a may be similar to a degree of difficulty of critical dimension measurement of mask patterns within the sixth measurement site 20f. Thus, the first and second measurement sites 20a and 20b may be set as default measurement sites.

Within measurement sites of which the critical dimension measurement is performed sequentially, as the arrangement density of a mask pattern decreases and the size or width of the mask pattern increases, a degree of difficulty of critical dimension measurement of the mask pattern may decrease. Similarly, as the arrangement density of a mask pattern increases and the size or width of the mask pattern decreases, a degree of difficulty of critical dimension measurement of the mask pattern may increase.

When the first to sixth measurement sites 20a to 20f of the photomask 20 are provided as a plurality of measurement sites, the subsequent measurement site, described above, may be a measurement site preceding another measurement site. Thus, the preceding measurement site may be the simple measurement site.

In an example, when a measurement site that may be the preceding measurement site among the first to sixth measurement sites 20a to 20f of the photomask 20 is the simple measurement site, a measurement site that may be the subsequent measurement site thereamong may be the default measurement site or the simple measurement site. For example, when a degree of difficulty of critical dimension measurement of a mask pattern within the subsequent measurement site is higher than a degree of difficulty of critical dimension measurement of a mask pattern within the preceding measurement site that may be the simple measurement site, the subsequent measurement site may be set or classified as the default measurement site, and when a degree of difficulty of critical dimension measurement of a mask pattern within the subsequent measurement site is lower than or equal to a degree of difficulty of critical dimension measurement of a mask pattern within the preceding measurement site, the subsequent measurement site may be set or classified as the simple measurement site.

In an example, when the fourth measurement site 20d corresponding to the fourth layout area 30d, described above with reference to FIG. 2, is the simple measurement site and the preceding measurement site, and the fifth measurement site 20e corresponding to the fifth layout area 30e is the subsequent measurement site, a mask pattern within the fifth measurement site 20e may have a higher arrangement density than a mask pattern within the fourth measurement site 20d. Thus, the fifth measurement site 20e may be set or classified as the default measurement site.

In an exemplary embodiment of the present inventive concept, the first to sixth measurement sites 20a to 20f may be set or classified as the default measurement site and the simple measurement site, using surface potential information on mask patterns obtained from the surface potential measurement unit 110 of the critical dimension measurement apparatus 100. For example, when a mask pattern within the subsequent measurement site has substantially the same potential as a mask pattern within the preceding measurement site, the subsequent measurement site may be set or classified as the simple measurement site. For example, when a mask pattern within the subsequent measurement site has a different surface potential from a mask pattern within the preceding measurement site, the subsequent measurement site may be set or classified as the default measurement site.

In an exemplary embodiment of the present inventive concept, when the sum of lengths of measurement regions of interest of mask patterns within any one measurement site is greater than the length A of the reference measurement region of interest described above with reference to FIG. 6, the one measurement site may be set or classified as the simple measurement site, and when the sum of lengths of measurement regions of interest of mask patterns within any one measurement site is less than the length A of the reference measurement region of interest described above with reference to FIG. 6, the one measurement site may be set or classified as the default measurement site.

Examples of a method of measuring the critical dimensions of the first mask pattern within the default measurement site in the default measurement mode and a method of measuring the critical dimensions of the second mask pattern within the simple measurement site in the simple measurement mode described above with reference to FIG. 7A or 7B, will be described with reference to FIGS. 8A and 8B.

Figure 8A:
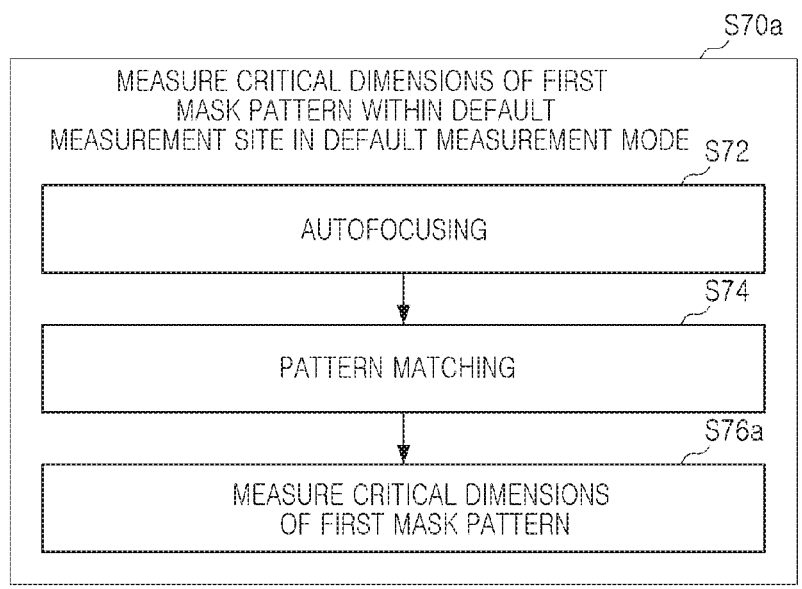
FIGS. 8A and 8B are flowcharts illustrating a method of measuring critical dimensions, according to exemplary embodiments of the present inventive concept.
Figure 8B:
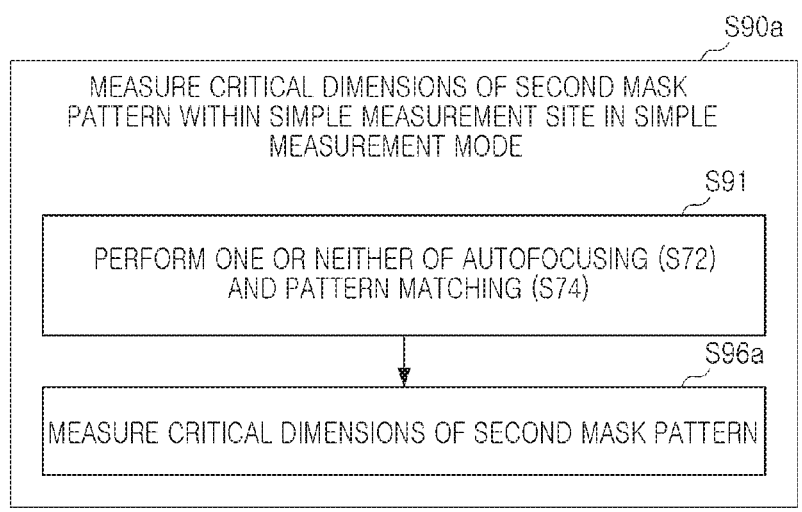

FIGS. 8A and 8B are flowcharts illustrating a method of measuring critical dimensions, according to exemplary embodiments of the present inventive concept.

Referring to FIG. 7A or 7B, and 8A, the critical dimensions of the first mask pattern within the default measurement site may be measured in the default measurement mode (S70a). Measuring the critical dimensions of the first mask pattern within the default measurement site in the default measurement mode may include autofocusing (S72) for the first mask pattern, pattern matching (S74) for the first mask pattern, and measuring the critical dimensions of the first mask pattern (S76a).

Autofocusing (S72) may refer to focusing the electron beam 145 of FIG. 1 on the surface of the photomask 20 with the object lens 142 of FIG. 1.

Pattern matching (S74) may include matching a reference pattern previously stored in the information storage part 163 of the control unit 160 with the first mask pattern. The reference pattern may be a pattern that may be obtained from the layout 30, or a pattern that may be obtained from image information on a mask pattern of the photomask 20. Thus, pattern matching (S74) may allow the critical dimensions of a measurement region of interest of the first mask pattern corresponding to the measurement region of interest described above with reference to FIG. 6 to be accurately measured.

Referring to FIG. 7A or 7B, and 8B, the critical dimensions of the second mask pattern within the simple measurement site may be measured in the simple measurement mode (S90a). Measuring the critical dimensions of the second mask pattern within the simple measurement site in the simple measurement mode may include performing one or neither of autofocusing (S72) and pattern matching (S74) for the second mask pattern (S91), and measuring the critical dimensions of the second mask pattern (S96a).

Since a degree of difficulty of critical dimension measurement of the second mask pattern within the simple measurement site is lower than a degree of difficulty of critical dimension measurement of the first mask pattern within the default measurement site, even when one or neither of autofocusing (S72) and pattern matching (S74) for the second mask pattern is performed, the second mask pattern may be measured and the critical dimensions of the measurement region of interest of the second mask pattern may be produced.

Thus, the method of measuring the critical dimensions of the second mask pattern within the simple measurement site in the simple measurement mode may include performing one or neither of autofocusing (S72) and pattern matching (S74) for the second mask pattern, as compared to the method of measuring the critical dimensions of the first mask pattern within the default measurement site in the default measurement mode, thus reducing an amount of time required to measure the critical dimensions of the mask patterns of the photomask 20.

In an exemplary embodiment of the present inventive concept, when a measurement site among the measurement sites of the photomask 20 is set or classified as the simple measurement site, pattern matching (S74) for the measurement site may not be performed and critical dimension measurement thereof may be performed.

In an exemplary embodiment of the present inventive concept, when the subsequent measurement site that may be the simple measurement site, among the measurement sites of the photomask 20, is adjacent to the preceding measurement site thereamong, autofocusing (S72) for the subsequent measurement site may not be performed and critical dimension measurement thereof may be performed.

In an exemplary embodiment of the present inventive concept, using potential information on mask patterns obtained from the surface potential measurement unit 110 of the critical dimension measurement apparatus 100, as described above with reference to FIG. 1, any one of autofocusing (S72) and pattern matching (S74) for the mask patterns may not be performed and critical dimension measurement thereof may be performed. For example, when a mask pattern within the subsequent measurement site has substantially the same potential as a mask pattern within the preceding measurement site, autofocusing (S72) and pattern matching (S74) for the mask pattern within the subsequent measurement site may not be performed and critical dimension measurement thereof may be performed.

In an exemplary embodiment of the present inventive concept, as described above with reference to FIG. 6, when the length of a measurement region of interest of a measurement site is greater than the length A of the reference measurement region of interest, pattern matching (S74) for the measurement site may not be performed and critical dimension measurement thereof may be performed. The length of the measurement region of interest of the measurement site may be the sum of lengths of measurement regions of interest of all of mask patterns to be measured within any one measurement site. For example, a plurality of mask patterns to be measured may be within any one measurement site and each of the mask patterns to be measured may have a measurement region of interest, so that the measurement regions of interest having a plurality of lengths may be present within the one measurement site. Thus, when the sum of lengths of measurement regions of interest is greater than the length A of the reference measurement region of interest of FIG. 6 within the any one measurement site, the one measurement site may be set as the simple measurement site, and pattern matching (S74) for the one measurement site may not be performed and the critical dimension measurement thereof may be performed.

Figure 9A:
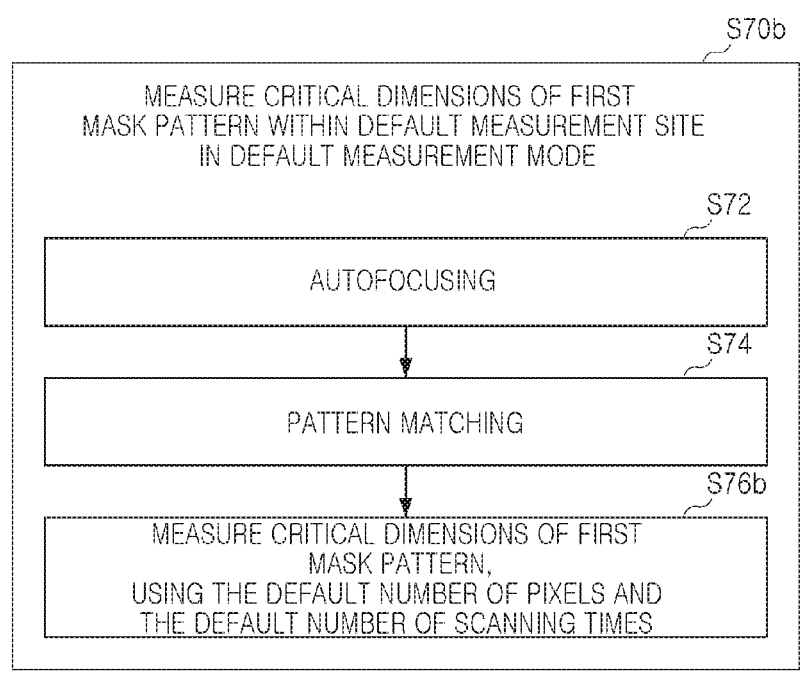
FIGS. 9A, 9B, and 9C are flowcharts illustrating a method of measuring critical dimensions, according to exemplary embodiments of the present inventive concept.
Figure 9B:
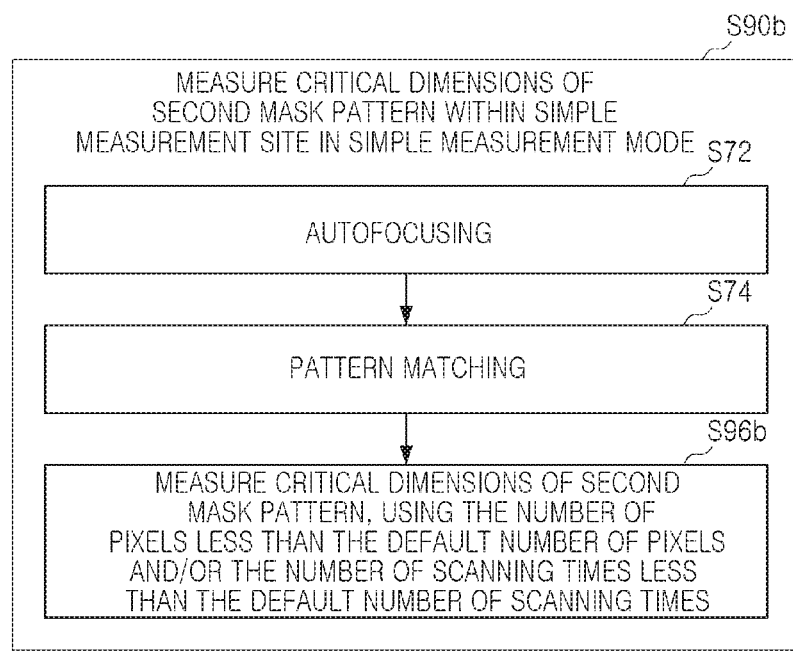
Figure 9C:
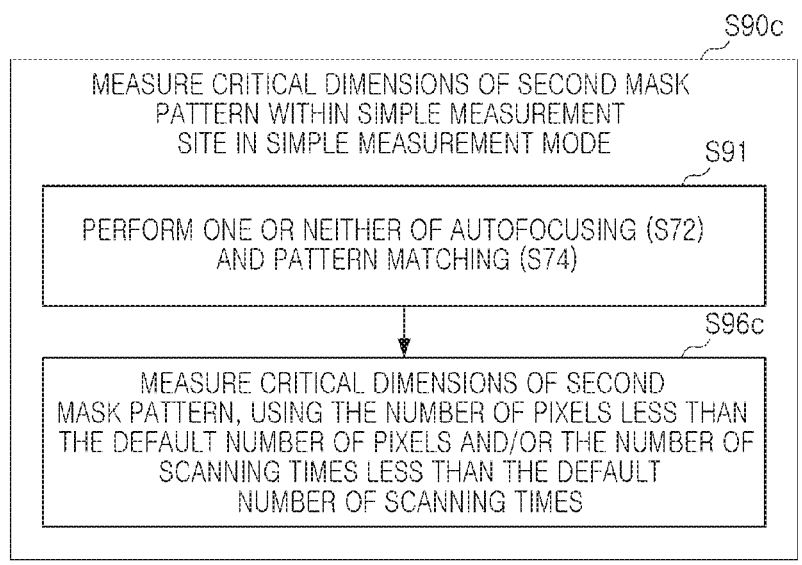

In an exemplary embodiment of the present inventive concept, the number of pixels and the number of scanning times may be adjusted to reduce an amount of time required to measure the critical dimensions of mask patterns of the photomask 20. Similar to as described above, examples of a method of measuring critical dimensions, which may reduce an amount of time required to measure critical dimensions by adjusting the number of pixels and the number of scanning times, will be described with reference to FIGS. 9A, 9B, and 9C. FIGS. 9A, 9B, and 9C are flowcharts illustrating a method of measuring critical dimensions, according to exemplary embodiments of the present inventive concept.

Referring to FIG. 7A or 7B, and 9A, the critical dimensions of the first mask pattern within the default measurement site may be measured in the default measurement mode (S70b). Measuring the critical dimensions of the first mask pattern within the default measurement site in the default measurement mode may include autofocusing (S72) for the first mask pattern, pattern matching (S74) for the first mask pattern, and measuring the critical dimensions of the first mask pattern (S76b). Measuring the critical dimensions of the first mask pattern (S76b) may be performed using a default number of pixels and a default number of scanning times. The default measurement mode may include measuring the critical dimensions of the first mask pattern, using the default number of pixels and the default number of scanning times.

Referring to FIG. 7A or 7B, and 9B, the critical dimensions of the second mask pattern within the simple measurement site may be measured in the simple measurement mode (S90b). Measuring the critical dimensions of the second mask pattern within the simple measurement site in the simple measurement mode may include autofocusing (S72) for the second mask pattern, pattern matching (S74) for the second mask pattern, and measuring the critical dimensions of the second mask pattern (S96a). Measuring the critical dimensions of the second mask pattern (S96b) may be performed using a number of pixels less than the default number of pixels and/or a number of scanning times less than the default number of scanning times. The simple measurement mode may include measuring the critical dimensions of the second mask pattern, using the number of pixels less than the default number of pixels or the number of scanning times less than the default number of scanning times.

In an example, the default number of pixels may be about 1,024, and the number of pixels less than the default number of pixels may be about 512. In an example, the default number of scanning times may be about 48, and the number of scanning times less than the default number of scanning times may be about 16 or 32. The numbers, associated with the pixels and the scanning times, are only examples, and may be modified.

Referring to FIG. 9C, the critical dimensions of the second mask pattern within the simple measurement site may be measured in the simple measurement mode (S90c). Measuring the critical dimensions of the second mask pattern within the simple measurement site in the simple measurement mode may include performing one or neither of autofocusing (S72) and pattern matching (S74) for the second mask pattern (S91) and measuring the critical dimensions of the second mask pattern (S96c). Measuring the critical dimensions of the second mask pattern (S96c) may be performed using the number of pixels less than the default number of pixels and/or the number of scanning times less than the default number of scanning times. Thus, an amount of time required to measure the critical dimensions of mask patterns may be reduced.

The above-mentioned exemplary embodiments of the critical dimension measurement system and the method of measuring critical dimensions may be applied to measure the critical dimensions of mask patterns of a photomask. However, the present inventive concept is not limited thereto. For example, the above-mentioned exemplary embodiments of the critical dimension measurement system and the method of measuring critical dimensions may be applied to measure the critical dimensions of various patterns, as well as mask patterns of a photomask. For example, the above-mentioned exemplary embodiments of the critical dimension measurement system and the method of measuring critical dimensions may also be applied to measure the critical dimensions of various patterns formed on a semiconductor wafer. For example, the above-stated photomask may be replaced with a wafer, and the previously mentioned mask patterns may be replaced with photoresist patterns or circuit patterns.

The various operations of methods described above may be performed by any suitable means capable of performing the operations, such as various hardware and/or software component(s), circuits, and/or module(s).

The software may comprise an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

As set forth above, according to exemplary embodiments of the present inventive concept, a critical dimension measurement method and a critical dimension measurement system, which may reduce an amount of time required to measure critical dimensions of mask patterns of a photomask, may be provided. Thus, a critical dimension measurement apparatus may measure the critical dimensions of a larger number of photomasks. Further, the critical dimension measurement method and the critical dimension measurement system may reduce the amount of time required to measure the critical dimensions of the mask patterns, thus enabling the photomask to be formed within a shorter period of time and using the photomask in a photolithography process. Accordingly, the critical dimension measurement method and the critical dimension measurement system may reduce an amount of time required to fabricate a semiconductor device from a layout, which may increase productivity.

While the present inventive concept has been shown and described above with reference to exemplary embodiments thereof, it will be apparent to those of ordinary skill in the art that modifications and variations in form and details could be made thereto without departing from the spirit and scope of the present inventive concept, as set forth by the following claims.

What is claimed is:

1. A method of measuring critical dimensions, comprising:
   forming a layout including layout patterns;
   forming a photomask including mask patterns corresponding to the layout patterns;
   storing information on the layout patterns;
   classifying measurement sites of the photomask as either a default measurement site or a simple measurement site, using the information on the layout patterns;
   measuring critical dimensions of a first mask pattern within the default measurement site in a default measurement mode; and
   measuring critical dimensions of a second mask pattern within the simple measurement site in a simple measurement mode,
   wherein the simple measurement mode runs for a shorter time than the default measurement mode.

2. The method of claim 1, wherein the default measurement mode includes performing autofocusing and pattern matching on the first mask pattern and measuring critical dimensions of the first mask pattern, and
   the simple measurement mode includes performing one or neither of autofocusing and pattern matching on the second mask pattern and measuring critical dimensions of the second mask pattern.

3. The method of claim 2, wherein the default measurement mode includes measuring critical dimensions of the first mask pattern, using a default number of pixels and a default number of scanning times, and
   the simple measurement mode includes measuring critical dimensions of the second mask pattern, using a number of pixels less than the default number of pixels or a number of scanning times less than the default number of scanning times.

4. The method of claim 1, wherein the default measurement mode includes measuring critical dimensions of the first mask pattern, using a default number of pixels and a default number of scanning times, and
   the simple measurement mode includes measuring critical dimensions of the second mask pattern, using a number of pixels less than the default number of pixels or a number of scanning times less than the default number of scanning times.

5. The method of claim 1, wherein classifying the measurement sites of the photomask as either the default measurement site and or the simple measurement site further includes using the information on layout patterns, corresponding to the mask patterns, arranged on each of the measurement sites of the photomask.

6. The method of claim 5, wherein the information on the layout patterns includes information on an arrangement density and a width of each of the layout patterns and on a length of each of measurement regions of interest of the layout patterns.

7. The method of claim 5, wherein the information on the layout patterns includes information on a first layout pattern, corresponding to the first mask pattern, and on a second layout pattern, corresponding to the second mask pattern.

8. The method of claim 7, wherein an arrangement density of the second layout pattern is lower than an arrangement density of the first layout pattern, and the measurement sites including the first mask pattern and the second mask pattern are classified as the default measurement site and the simple measurement site, using information on the arrangement densities of the first layout pattern and the second layout pattern.

9. The method of claim 7, wherein a width of the second layout pattern is greater than a width of the first layout pattern, and
the measurement sites including the first mask pattern and the second mask pattern are classified as the default measurement site and the simple measurement site, using information on the widths of the first layout pattern and the second layout pattern.

10. The method of claim 7, wherein a length of a measurement region of interest of the second layout pattern is greater than a length of a measurement region of interest of the first layout pattern, and
the measurement sites including the first mask pattern and the second mask pattern are classified as the default measurement site and the simple measurement site, using information on the measurement regions of interest of the first layout pattern and the second layout pattern.

11. The method of claim 1, further comprising
measuring a potential of the first mask pattern;
measuring a potential of the second mask pattern; and
storing information on the potentials of the first and second mask patterns,
wherein classifying the measurement sites of the photomask as the default measurement site and the simple measurement site further includes using the potentials information on the first and second mask patterns, together with the information on the layout patterns, and
wherein the first mask pattern and the second mask pattern are spaced apart from each other.

12. A method of measuring critical dimensions, comprising:
forming a layout including layout patterns;
forming mask patterns corresponding to the layout patterns;
setting, with a control circuit of a critical dimension measurement apparatus, a default measurement mode and a simple measurement mode running for a shorter time than the default measurement mode, using information on the layout patterns;
measuring critical dimension of a first mask pattern of the mask patterns within the default measurement mode; and
measuring critical dimension of a second mask pattern of the mask patterns within the simple measurement mode,
wherein the first mask pattern and the second mask pattern are spaced apart from each other.

13. The method of claim 12, wherein the default measurement mode includes autofocusing and pattern matching, and
the simple measurement mode excludes autofocusing and pattern matching.

14. The method of claim 12, wherein the default measurement mode includes measuring critical dimensions of the first mask pattern, using a default number of pixels and a default number of scanning times, and
the simple measurement mode includes measuring critical dimensions of the second mask pattern, using a number of pixels less than the default number of pixels or a number of scanning times less than the default number of scanning times.

15. The method of claim 12, wherein a substrate and the mask patterns form a photomask.

16. A method of measuring critical dimensions, comprising:
forming a layout including layout patterns, using a computer system;
forming a photomask including mask patterns corresponding to the layout patterns, using a mask manufacturing apparatus;
storing information on a default measurement site and a simple measurement site of the photomask with a critical dimension measurement apparatus;
measuring, with the critical dimension measurement apparatus, critical dimensions of a first mask pattern within the default measurement site in a default measurement mode; and
measuring, with the critical dimension measurement apparatus, critical dimensions of a second mask pattern within the simple measurement site in a simple measurement mode running for a shorter time than the default measurement mode.

17. The method of claim 16, wherein the critical dimension measurement apparatus includes:
a surface potential measurement circuit configured to measure potentials of the mask patterns;
a control circuit including an information storage circuit configured to store distribution information on the potentials of the mask patterns and information on the layout patterns; and
a critical dimension measurement circuit configured to measure critical dimensions of the mask patterns, while exchanging an electrical signal with the control circuit,
wherein the control circuit classifies measurement sites of the photomask as the default measurement site and the simple measurement site, using the distribution information on the potentials of the mask patterns and the information on the layout patterns stored in the information storage circuit.

18. The method of claim 17, wherein the surface potential measurement circuit includes at least two probes for contacting surfaces of the mask patterns.

19. The method of claim 16, wherein storing the information on the default measurement site and the simple measurement site of the photomask in the critical dimension measurement apparatus includes:
obtaining information on an arrangement density and a width of each of the layout patterns, corresponding to the mask patterns within measurement sites of the photomask, and on a length of each of measurement regions of interest of the layout patterns; and
classifying the measurement sites as the default measurement site and the simple measurement site, using the information on the arrangement density and the width of each of the layout patterns and on the length of each of the measurement regions of interest of the layout patterns.

20. The method of claim 1, wherein the photomask further includes a substrate, a outer mask pattern on the substrate and a light blocking pattern on the outer mask pattern,
wherein the substrate includes glass or quartz,
wherein the mask patterns is on the substrate,
wherein the outer mask pattern and the mask patterns are spaced apart from each other, and wherein the outer mask pattern and the mask patterns include a compound of molybdenum (Mo) and silicon (Si).

\* \* \* \* \*